United States Patent [19]

Calderbank et al.

[11] Patent Number: 5,305,352
[45] Date of Patent: Apr. 19, 1994

[54] CODED MODULATION WITH UNEQUAL ERROR PROTECTION

[75] Inventors: Arthur R. Calderbank, Maplewood; Nambirajan Seshadri, Chatham, both of N.J.

[73] Assignee: AT&T Bell Laboratories, Murray Hill, N.J.

[21] Appl. No.: 786,164

[22] Filed: Oct. 31, 1991

[51] Int. Cl.⁵ ............................................... H04L 5/12
[52] U.S. Cl. ...................................... 375/39; 375/59; 375/94
[58] Field of Search .................... 375/34, 39, 94, 59; 370/110.1, 110.4; 358/12-15, 143, 142; 371/30, 43

[56] References Cited

U.S. PATENT DOCUMENTS

| | | | |
|---|---|---|---|
| 4,644,537 | 2/1987 | Gitlin et al. | 375/39 X |
| 5,105,443 | 4/1992 | Betts et al. | 375/39 |
| 5,134,464 | 7/1992 | Basile et al. | 358/12 |
| 5,164,963 | 11/1992 | Lawrence et al. | 358/13 X |
| 5,214,656 | 5/1993 | Chung et al. | 375/39 |

FOREIGN PATENT DOCUMENTS

| | | | |
|---|---|---|---|
| 485105 | 10/1991 | European Pat. Off. | H04L 27/34 |
| 485108 | 10/1991 | European Pat. Off. | H04L 27/34 |

OTHER PUBLICATIONS

W. F. Schreiber, "Spread-Spectrum Television Broadcasting", *SMPTE Jrn.*, Aug. 1992, pp. 538–549.

K. M. Uz et al., "Multiresolution Source & Channel Coding . . . ", *Signal Processing of HDTV, III*, 1992 Elsevier Science Publishers, pp. 61–69.

M. Vetterli et al. "Multiresolution Coding Techniques for Digital TV", *Multidimensional Systems & Signal Processing*, 1992, Kluwer Academic Publishers, Boston, pp. 53–59.

K. M. Uz et al., "Combined Multiresolution Source Coding & Modulation. . . ", *Signal Processing*, 1992, Elsevier Science Publs. pp. 283–290.

*Primary Examiner*—Stephen Chin
*Assistant Examiner*—Tesfaldet Bocure
*Attorney, Agent, or Firm*—Ronald D. Slusky; Gerard A. deBlasi

[57] ABSTRACT

Digital signals, such as digitized television signals, are subjected to a source coding step followed by a channel mapping step. The source coding step causes the signal to be represented by first and second data streams. The first stream carries data regarded as more important and the second carries data regarded as less important. In the channel mapping step, the mapping is such that the data elements of the various data streams have differing probabilities of being erroneously detected at the receiver. The channel mapping step includes at least one multi-level coding step. The signal constellations used in the channel mapping step are partitioned into supersymbols, in which the distance between the symbols of at least ones of the supersymbols is less than a parameter referred to as the maximum intra-subset distance (MID). Additionally, in some constellations, the minimum distance between at least ones of the symbols of at least one of the supersymbols is greater than the minimum distance between the symbols of the constellation as a whole while, again, still being less than the MID. The first data stream is used to identify a sequence of supersymbols, while the second data stream is used to select particular symbols from the identified supersymbols.

17 Claims, 8 Drawing Sheets

CODED MODULATION WITH UNEQUAL ERROR PROTECTION

BACKGROUND OF THE INVENTION

The present invention relates to the transmission of digital data including, particularly, the transmission of digital data which represents television (TV) signals.

It is generally acknowledged that some form of digital transmission will be required for the next generation of television technology, conventionally referred to as high definition television, or HDTV. This requirement is due mostly to the fact that much more powerful video compression schemes can be implemented with digital signal processing than with analog signal processing. However, there has been some concern about getting committed to an all-digital transmission system because of the potential sensitivity of digital transmission to small variations in signal-to-noise ratio, or SNR, at the various receiving locations.

This phenomenon—sometimes referred to as the "threshold effect"—can be illustrated by considering the case of two television receivers that are respectively located at 50 and 63 miles from a television broadcast station. Since the power of the broadcast signal varies roughly as the inverse square of the distance, it is easily verified that the difference in the amount of signal power received by the television receivers is about 2 dB. Assume, now, that a digital transmission scheme is used and that transmission to the receiver that is 50 miles distant exhibits a bit-error rate of $10^{-6}$. If the 2 dB of additional signal loss for the other TV set translates into a 2 dB decrease of the SNR at the input of the receiver, then this receiver will operate with a bit-error rate of about $10^{-4}$. With these kinds of bit-error rates, the TV set that is 50 miles away would have a very good reception, whereas reception for the other TV set would probably be very poor. This kind of quick degradation in performance over short distances is generally not considered acceptable by the broadcasting industry. (By comparison, the degradation in performance for presently used analog TV transmission schemes is much more graceful.)

There is thus required a digital transmission scheme adaptable for use in television applications which overcomes this problem. Solutions used in other digital transmission environments—such as the use of a) regenerative repeaters in cable-based transmission systems or b) fall-back data rates or conditioned telephone lines in voiceband data applications—are clearly inapplicable to the free-space broadcast environment of television.

The co-pending, commonly assigned U.S. patent application of V. B. Lawrence et al entitled "Coding for Digital Transmission," Ser. No. 611,225, now U.S. Pat. No. 5,164,963, issued Nov. 17, 1992, and hereby incorporated by reference, discloses an advantageous technique for overcoming the shortcomings of standard digital transmission for over-the-air broadcasting of digital TV signals. The technique—referred to herein generically as "unequal-error-protection signaling"—comprises a particular type of source coding step followed by a particular type of channel mapping step. More specifically, the source coding step causes the television signal to be represented by two or more data streams while, in the channel mapping step, the mapping is such that the data elements of the various data streams have differing probabilities of channel-induced error, i.e., different probabilities of being erroneously detected at the receiver. Illustratively, a first one of the aforementioned data streams carries components of the overall television signal which are regarded as the most important—for example, the audio, the framing information, and the vital portions of the video information——and that data stream is mapped such that its data elements have the lowest probability of channel-induced error. A second one of the data streams carries components of the overall television signal which are regarded as less important than those of the first data stream and that data stream is mapped such that its data elements have a probability of channel-induced error that is not as low as those of the first data stream. In general, it is possible to represent the overall television signal with any number of data streams, each carrying components of varying importance and each having a respective probability of error. This approach allows a graceful degradation in reception quality at the TV set location because, as the bit error rate at the receiver begins to increase with increasing distance from the broadcast transmitter, it will be the bits that represent relatively less important portions of the TV signal information that will be the first to be affected.

Going further, the co-pending, commonly assigned U.S. patent application of L. Wei, entitled "Coded Modulation with Unequal Error Protection," now U.S. Pat. No. 5,105,442, issued Apr. 14, 1992, and hereby incorporated by reference, discloses a scheme which implements the above-described overall concept of the Lawrence et al application—i.e., provides different levels of error protection for different classes of data elements generated by the source encoding step—but which provides enhanced noise immunity via the use of coded modulation, such as trellis-coded modulation.

In the Wei arranement, more particularly, the symbols in a predetermined 2N-dimensional channel symbol constellation, $N \geq 1$, are divided into groups, each of which is referred to as a "supersymbol." During each of a succession of symbol intervals, a predetermined number of the most important data elements are channel encoded, and the resulting channel coded data elements identify a particular one of the supersymbols. The remaining data elements, which may also be channel encoded, are used to select for transmission a particular symbol from the identified supersymbol.

The Wei approach as thus far described is similar in a general way to conventional coded modulation schemes in that the latter also divide the channel symbols into groups, typically referred to as "subsets." However, in conventional coded modulation schemes, the subsets are formed under the constraint that the minimum Euclidean distance (hereinafter referred to as the "minimum distance ") between the symbols in a subset is greater than the minimum distance between the symbols in the constellation as a whole. In Wei, however, the minimum distance between the symbols of a supersymbol is the same as the minimum distance between the symbols in the constellation as a whole. This distance property allows for greater amount of noise immunity for the most important data elements than for the other data elements, that immunity being optimized by keeping the minimum distance between supersymbols as large as possible—usually greater than the minimum distance between the symbols of the constellation. Specifically, once the supersymbols are defined, it is possible to design codes for the most important data elements based on the distances between the supersymbols, i.e., as though each supersymbol were a conventional symbol in a conventional constellation. This being so, a particular degree of noise immunity can be achieved for the most important data elements that is greater than what can be achieved for the other data elements.

SUMMARY OF THE INVENTION

The present invention provides a new class of signal constellations that can be used in unequal error protection signaling schemes of the type taught in the aforementioned Wei patent application. Advantageously, the availability of such constellations provides the designer of unequal error protection signaling schemes with additional flexibility in meeting desired design criteria such as particular different combinations of a) percentage of most important data elements, b) degree of overall code redundancy, d) coding gains, etc. In particular, in these new constellations, the minimum distance between at least ones of the symbols of at least one of the supersymbols is a) greater than the minimum distance between the symbols of the constellation as a whole—which is in contradistinction to the supersymbol arrangements disclosed by Wei, while being b) less than a parameter defined herein as the "minimum intra-subset distance (MID)—which is in contradistinction to the subset arrangements of standard equal error protection signaling schemes.

In accordance with a feature of the invention, the probability that the less important data element values will be decoded properly is enhanced by a particular scheme for assigning less important data element values to particular symbols within a supersymbol. In particular, a pair of symbols from respective different supersymbols are assigned to the same less important data element values if the distance between that pair of symbols is the minimum distance between any pair of symbols of those two supersymbols.

BRIEF DESCRIPTION OF THE DRAWING

In the drawing,

FIGS. 9–14 depict further signal constellations that can alternatively be used by the transmitter of FIG. 1.

DETAILED DESCRIPTION

Before proceeding with a description of the illustrative embodiments, it should be noted that various ones of the digital signaling concepts described herein are all well known in, for example, the digital radio and voice-band data transmission (modem) arts and thus need not be described in detail herein. These include such concepts as multidimensional signaling using 2N-dimensional channel symbol constellations, where N is some integer; trellis coding; scrambling; passband shaping; equalization; Viterbi, or maximum-likelihood, decoding; etc. These concepts are described in such U.S. patents as U.S. Pat. No. 3,810,021, issued May 7, 1974 to I. Kalet et al.; U.S. Pat. No. 4,015,222, issued Mar. 29, 1977 to J. Werner; U.S. Pat. No. 4,170,764, issued Oct. 9, 1979 to J. Salz et al.; U.S. Pat. No. 4,247,940, issued Jan. 27, 1981 to K. H. Mueller et al.; U.S. Pat. No. 4,304,962, issued Dec. 8, 1981 to R. D. Fracassi et al.; U.S. Pat. No. 4,457,004, issued Jun. 26, 1984 to A. Gersho et al.; U.S. Pat. No. 4,489,418, issued Dec. 18, 1984 to J. E. Mazo; U.S. Pat. No. 4,520,490, issued May 28, 1985 to L. Wei; and U.S. Pat. No. 4,597,090, issued Jun. 24, 1986 to G. D. Forney, Jr.—all of which are hereby incorporated by reference.

It may also be noted before proceeding that various signal leads shown in the FIGS. may carry analog signals, serial bits or parallel bits, as will be clear from the context.

Figure 1:
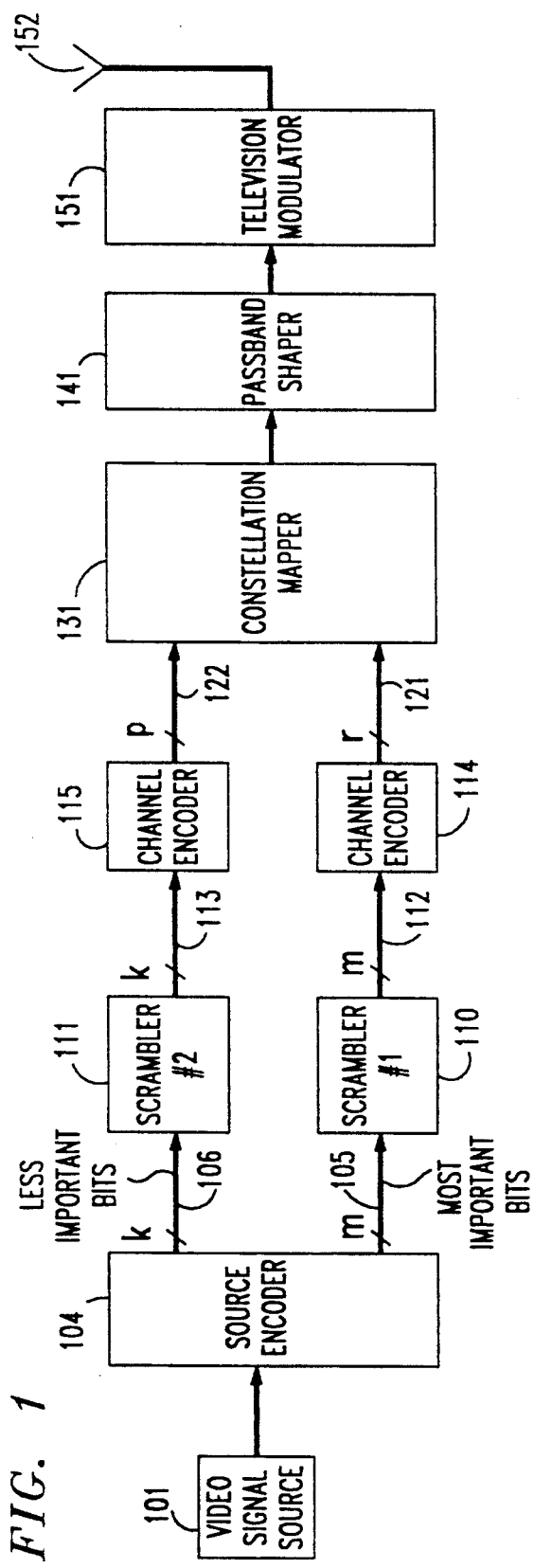
FIG. 1 is a block diagram of a transmitter in which the present invention can be used.

Turning now to FIG. 1, television (TV) signal source 101 generates an analog video signal representing picture information or "intelligence," which signal is passed on to source encoder 104. The latter generates a digital signal comprised of data elements in which at least one subset of the data elements represents a portion of the information, or intelligence, that is more important than the portion of the information, or intelligence, represented by the rest of the data elements. Illustratively, each data element is a data bit, with an average $m+k$ information bits being generated for each of a succession of symbol intervals. The symbol intervals are comprised of N signaling intervals, where 2N is the number of dimensions of the constellation (as described below). The signaling intervals have duration of T seconds and, accordingly, the symbol intervals each have a duration of NT seconds. The embodiments explicitly disclosed herein happen to use two-dimensional constellations, i.e., $N=1$, For those embodiments, then, the signaling intervals and the symbol intervals are the same.

Of the aforementioned $m+k$ information bits, the bits within the stream of m bits per symbol interval, appearing on lead 105, are more important than the bits within the stream of k bits per symbol interval, appearing on lead 106.

The bits on leads 105 and 106 are independendently scrambled in scramblers 110 and 111, which respectively output m and k parallel bits on leads 112 and 113. (Scrambling is customarily carried out on a serial bit stream. Thus although not explicitly shown in FIG. 1, scramblers 110 and 111 may be assumed to perform a parallel-to-serial conversion on their respective input bits prior to scrambling and a serial-to-parallel conversion at their outputs.) The signal is then channel mapped. In particular, the respective groups of bits on leads 112 and 113 are extended to channel encoders 114 and 115 which generates, for each symbol interval, respective expanded groups of r and p bits on leads 121 and 122, where $r>m$ and $p>k$. The values of those bits jointly identify a particular channel symbol of a predetermined constellation of channel symbols (such as the constellation of FIG. 4 as described in detail hereinbelow). Complex plane coordinates of the identified channel symbol are output by constellation mapper 131, illustratively realized as a lookup table or as a straightforward combination of logic elements. Conventional passband shaping and television modulation are then performed by passband shaper 141 and television modulator 151, respectively. The resultant analog signal is then broadcast via antenna 152 over a communication channel, in this case a free-space channel.

Figure 3:
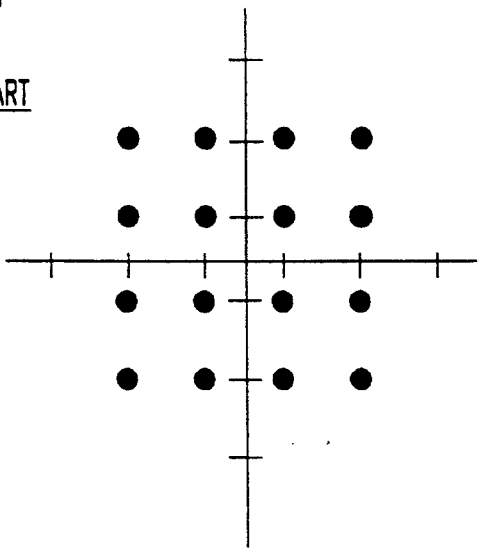
FIG. 3 depicts a prior art signal constellation.

It will be useful at this point to digress to a consideration of FIG. 3. The latter depicts a standard two-dimensional data transmission constellation of the type conventionally used in digital radio and voiceband data transmission systems. In this standard scheme—conventionally referred to as quadrature-amplitude modulation (QAM)—data words each comprises of four information bits are each mapped into one of 16 possible two-dimensional channel symbols. Each channel symbol has an in-phase, or I, coordinate on the horizontal axis and has a quadrature-phase, or Q, coordinate on the vertical axis. On each axis, the channel symbol coordinates are $\pm 1$ or $\pm 3$ so that the distance between each symbol and each of the symbols that are horizontally or vertically adjacent to it is the same for all symbols—that distance being "2". As a result of this uniform spacing, essentially the same amount of noise immunity is provided for all four information bits.

As is well known, it is possible to provide improved noise immunity without sacrificing bandwidth efficiency (information bits per signaling interval) using a coded modulation approach in which an "expanded" two-dimensional constellation having more than (in this example) 16 symbols is used in conjunction with a trellis or other channel code. For example, the above-cited '490 patent discloses the use of a 32-symbol, two-dimensional constellation together with an 8-state trellis code. That coded modulation scheme achieves approximately 4 dB of enhanced noise immunity over the uncoded case of FIG. 3, while still providing for the transmission of four information bits per signaling interval. Here, too, however, essentially the same amount of noise immunity is provided for all four information bits.

In accordance with the teachings of the aforementioned Wei patent application, the known noise immunity and bandwidth efficiency advantages of coded modulation are achieved while providing different levels of protection against channel-induced error for different classes of bits. Specifically, Wei teaches that it is possible to achieve a level of error protection for a class of most important bits which is substantially greater than what can be achieved with the aforementioned conventional coded modulation approach. Indeed, the transmitter of FIG. 1 embodies that concept, as will now be described in further detail.

Figure 4:
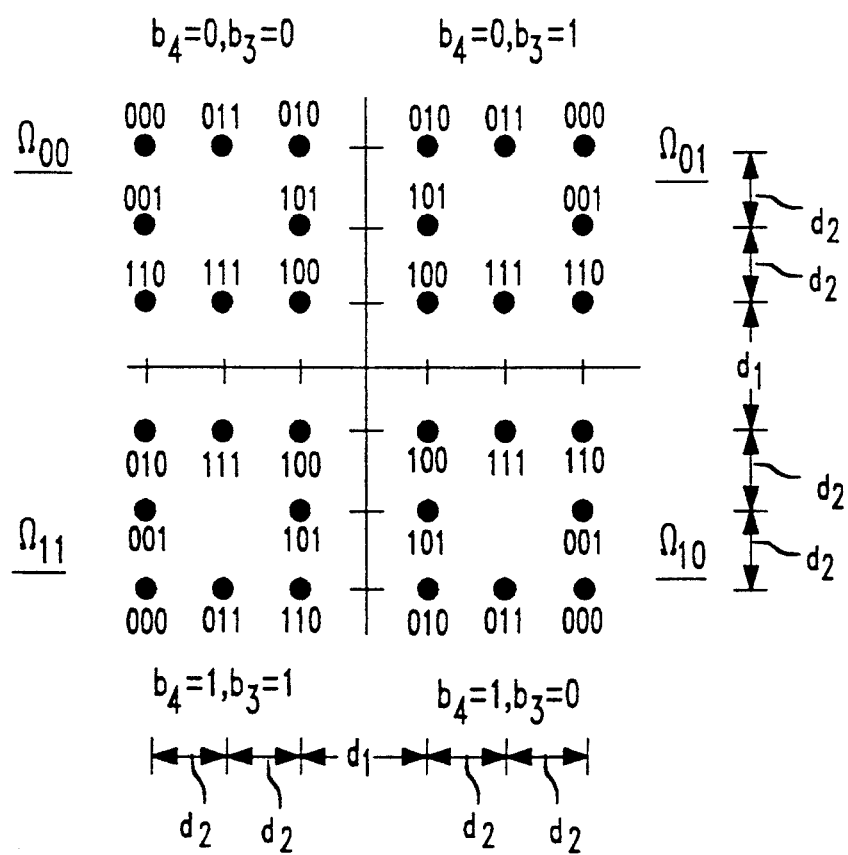
FIG. 4 depicts a signal constellation of the type disclosed in the Wei patent application.

The constellation used in the transmitter of FIG. 1 is illustratively the two-dimensional 32-symbol constellation shown in FIG. 4. The symbols in the signal constellation are divided into groups referred to as "supersymbols." Specifically, the constellation of FIG. 4 is divided into $2^r = 2^2 = 4$ supersymbols. In this example, the points in the four quadrants constitute respective supersymbols, as denoted by a box enclosing each group. The supersymbols are denoted generically as $\Omega_{b_4 b_3}$ where $b_4 = 0,1$ and $b_3 = 0,1$. The four supersymbols are thus $\Omega_{00}, \Omega_{01}, \Omega_{10},$ and $\Omega_{11}$.

In this example, m=1.625 and k=2.125 so that the overall bit rate is 3.75 bits per symbol with 43.33% of the bits being in the class of most important bits. (The manner in which such fractional average bit rates can be achieved in practice will become clear as this description continues.) Encoder 114 adds an average 0.375 redundant bits for every 1.625 bits that are input to encoder 114 so that r=2. Encoder 115 adds an average 0.875 redundant bits for every 2.125 bits that are input to encoder 115 so that p=3. The r=2 bits on lead 121 identify one of the four supersymbols and the p=3 symbols on lead 122 select a particular one of the eight channel symbols within the identified supersymbol. The partitioning of the constellation is such that the minimum distance between the symbols of a supersymbol—that distance being denoted as $d_2$ in FIG. 4—is the same as the minimum distance between the symbols in the constellation as a whole. Given this characteristic, increased noise immunity for the most important bits can be provided via appropriate selection of a) the codes implemented by encoders 114 and 115 and b) the ratio $d_1/d_2$—where $d_1$ is the minimum distance between the supersymbols. (The parameter $d_1$ is given by the minimum of the distances between all the pairs of supersymbols, with the distance between any pair of supersymbols being the minimum distance between any symbol of one of the pair of supersymbols and any symbol of the other.)

Specifically, as taught by Wei, a coded modulation scheme can now be constructed for the most important bits as though the four supersymbols were four conventional symbols in a conventional constellation. To design such a coded modulation scheme, the four supersymbols are partitioned, as is conventional, into a predetermined number of subsets. In this case, there are two subsets, where the value of $b_3$ denotes which subset each of the supersymbols belongs to. Thus, one subset, referred to as subset "0", comprises supersymbols $\Omega_{00}$ and $\Omega_{10}$ and the other, referred to as subset "1", comprises supersymbols $\Omega_{01}$ and $\Omega_{11}$. An appropriate code is used to encode the most important input bits to generate a stream of coded output bits which a) define a sequence of these subsets and b) for each subset of the sequence, select a particular supersymbol within that subset. The less important bits are then used to select for transmission a particular symbol from each of the thus-selected supersymbols. In this example, as already seen, this latter selection also involves the use of coded modulation.

In accordance with the invention disclosed in the copending, commonly assigned U.S. patent application of N. Seshadri, Ser. No. 07/785,723, filed of even date herewith, at least one of the channel encoders of the transmitter of FIG. 1 implements a multi-level code. In this example, in particular, both of them do. As noted earlier, a multi-level code is one in which the data elements—in this embodiment, bits—to be coded are divided into two or more substreams. Each of one or more of the substreams is then individually redundancy coded using a code of any desired type. The individual encoded substreams—along with any substreams that were left uncoded—form the output of the multi-level code.

Figure 5:
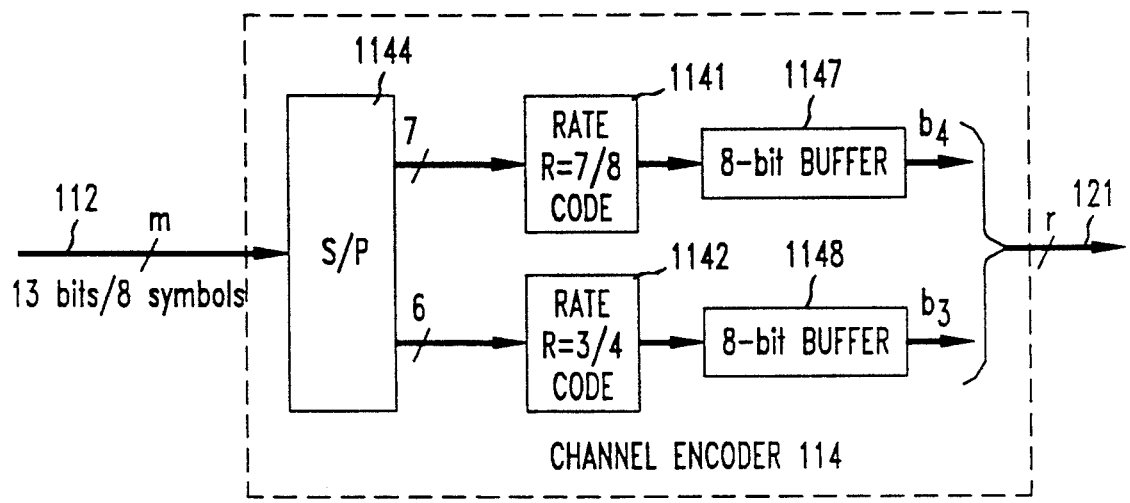
FIGS. 5 and 6 show multi-level coders useful in the transmitter of FIG. 1.
Figure 6:
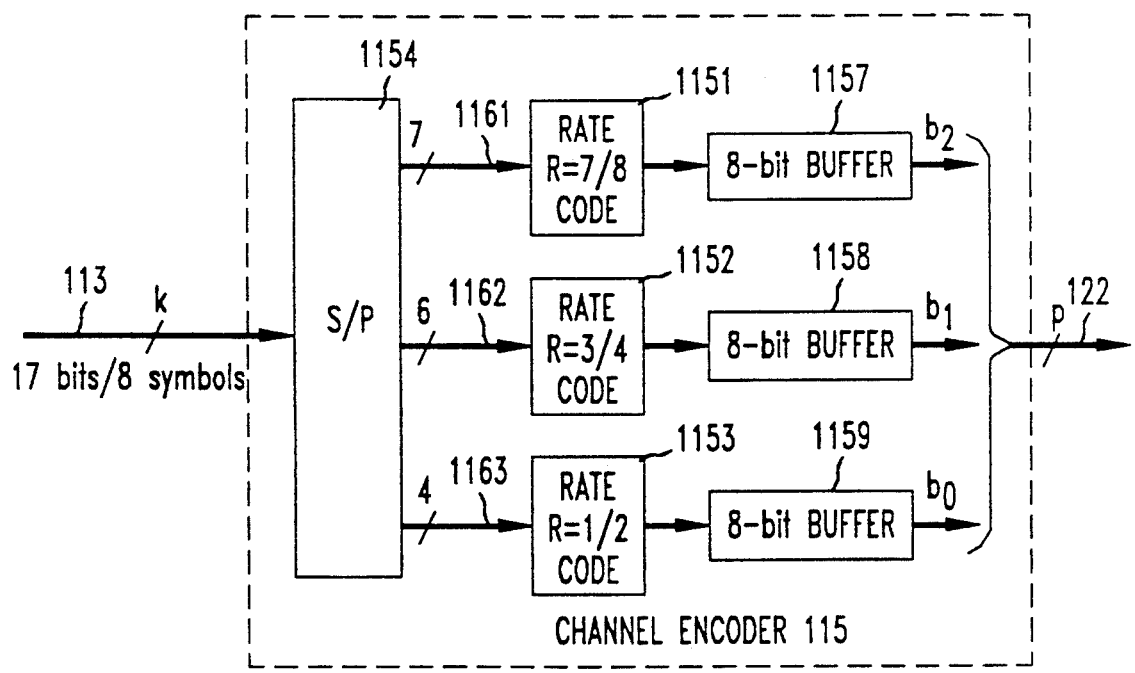

Particular illustrative embodiments for encoders 114 and 115 are shown in FIGS. 5 and 6, respectively. Encoder 114 implements a two-level code and, as such, includes two coders—coders 1141 and 1142. The redundancy code implemented by coder 1141 is a conventional rate $R=\frac{1}{2}$ zero-sum parity check code such as shown in G. C. Clark, Jr. and J. B. Cain, Error-Correction Coding for *Digital Communications* (New York: Plenum, 1981). The redundancy code implemented by coder 1142 is a conventional rate $R=\frac{3}{4}$ punctured convolutional code such as shown in Y. Yasuda et al. "High-rate punctured convolutional codes for soft decision Viterbi decoding, "*IEEE Trans. Comm.*, Vol.

COM-32, 1984, pp. 315-318. In operation, a serial-to-parallel (S/P) converter 1144 within encoder 114 takes in 13 bits over 8 symbol intervals, yielding an average input bit rate of m=1.625 bits per symbol interval as noted earlier. The output of converter 1144 comprises two substreams of bits. In one substream, the bits are provided in parallel groups of seven to coder 1141. In the other substream, the bits are provided in parallel groups of six to coder 1142. For every group of seven input bits, coder 1141 generates eight output bits which are applied to 8-bit buffer 1147. At the same time, for every group of six input bits, coder 1142 generates eight output bits which are applied to 8-bit buffer 1148. The contents of buffers 1147 and 1148 are read out synchronously in such a way that a pair of bits—one from each of the two buffers—is provided on lead 121 for each symbol interval. These bits are the aforementioned bits $b_3$ and $b_4$. As such, the former identifies one of the two subsets "0" and "1" and the other identifies one of the two supersymbols from the identified subset, the two bits $b_3$ and $b_4$ thus identifying one of the four supersymbols $\Omega_{00}$, $\Omega_{01}$, $\Omega_{10}$ and $\Omega_{11}$.

Encoder 115 implements a three-level code and, as such, includes coders 1151, 1152 and 1153. Coders 1151 and 1152 implement the same codes that are implemented by coders 1141 and 1142, respectively. Coder 1153 implements a rate $R=\frac{1}{2}$ convolutional code such as shown in the aforementioned Clark and Cain text. In operation, a serial-to-parallel (S/P) converter 1154 takes in 17 bits over 8 symbol intervals, yielding an average input bit rate of $k=2,125$ bits per symbol interval, as noted earlier. The output of converter 1154 comprises three substreams of bits. In one substream, the bits are provided in parallel groups of seven to coder 1151. In the second stream, the bits are provided in parallel groups of six to coder 1152. In the third group, the bits are provided in parallel groups of four to coder 1153. For every group of seven input bits, coder 1151 generates eight output bits which are applied to 8-bit buffer 1157. For every group of six input bits, coder 1152 generates eight output bits which are applied to 8-bit buffer 1158. For every group of four input bits, coder 1153 generates eight output bits which are applied to 8-bit buffer 1159.

The contents of buffers 1157, 1158 and 1159 are read out synchronously in such a way that three bits—one from each of the three buffers—are provided on lead 122 for each symbol interval. These three bits—denoted $b_2$, $b_1$ and $b_0$—select a particular symbol from the supersymbol identified at the output of encoder 114. To this end, each of the symbols in the constellation is labelled with a three-bit label as shown in FIG. 4. These three bits are, in fact, the aforementioned bits $b_2$, $b_1$ and $b_0$.

The symbols of each supersymbol are partitioned at a first level of partitioning into two subsets. Each subset is comprised of four symbols as denoted by the labelled $b_0$ value. Thus one subset is comprised of the four symbols denoted 000, 010, 100 and 110 and the other subset is comprised of the four symbols denoted 001, 011, 101 and 111. The symbols of each of these subsets are partitioned at a second level of partitioning into two second-level subsets, which are identified by their labelled $b_0$ and $b_1$ values. Each second-level subset is comprised of two symbols identified by $b_2$.

The assignment of three-bit labels to the symbols of each supersymbol is not arbitrary. Rather, the codes implemented by coders 1151, 1152 and 1153 are selected taking into account the minimum distance between the subsets at each level of partitioning. In particular, the most powerful, i.e., lowest-rate, code—in this case the rate $R=\frac{1}{2}$ code implemented by coder 1153—is used at the first level of partitioning to generate $b_0$ because the minimum distance between the subsets at the first level is the smallest, that distance being $d_1$. The second- and least-powerful codes, the rate $R=\frac{3}{4}$ and rate $R=\frac{7}{8}$ codes implemented by coders 1152 and 1151, respectively, generate $b_1$ and $b_2$, respectively, because the minimum distance between the second-level subsets is greater by a factor of $\sqrt{2}$ than that of the first level minimum distance whereas the minimum distance between the symbols in each second-level subset is greater by a factor of 2 than the first-level minimum distance.

The advantages provided by such use of multi-level codes in an unequal error protection signaling scheme are discussed hereinbelow. First, however, reference is made to the receiver of FIG. 2.

In particular, the analog broadcast signal is received by antenna 201; subjected to conventional television front-end processing in processing unit 211 including, for example, demodulation; and converted to digital form by A/D converter 212. The signal is then equalized by passband channel equalizer 221, which generates a signal representing the equalizer's best estimate as to the I and Q component values of the transmitted symbol. This estimate, which is referred to hereinbelow as the "received symbol signal," is passed on parallel rails 222 and 223 to be channel decoded by channel decoders 231 and 232. The function of channel decoder 231 is to identify the most likely sequence of supersymbols, while the function of channel decoder 232 is to identify the most likely sequence of symbols, given that sequence of supersymbols. The output of decoder 232 on lead 234 thus comprises the bits $b_3$ and $b_4$, while the output of decoder 231 on lead 233 thus comprises the bits $b_0$, $b_1$ and $b_2$.

Since the streams of most-important and less-important bits are, in this embodiment, both multi-level coded, the channel decoders 231 and 232 must each be multi-level decoders. Straightforward maximum likelihood decoding, such as a Viterbi decoding, could be employed for this purpose. However, the present illustrative embodiment uses a more refined approach to multi-level decoding—an approach referred to as multi-stage decoding. This is a well-known technique, the details of which can be found in A. R. Calderbank, "Multilevel codes and multistage decoding," *IEEE Trans. Comm.*, Vol. COM-37, pp. 222-29, 1989, hereby incorporated by reference. For present purposes, then, it suffices to summarize, in overview, how the multistage decoding is carried out.

Figure 15:
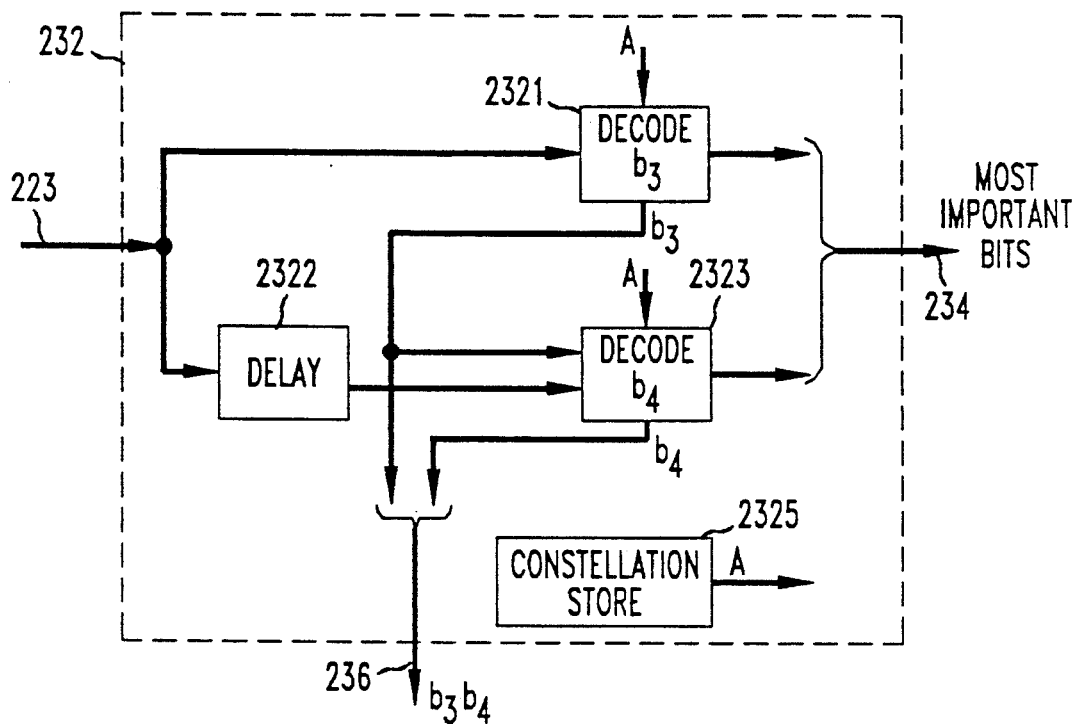
FIGS. 15 and 16 show illustrative multi-stage decodes used in the receiver of FIG. 2.

In particular, channel decoder 232 first recovers the bits encoded by coder 1142 within encoder 114 (FIG. 5), independent of, and without reference to, any decoding performed on the bits encoded by coder 1141. To this end, as shown in FIG. 15, decoder 232 includes decode $b_3$ circuitry 2321, decode $b_4$ circuitry 2323 and delay element 2322. In operation, the received symbol signal is processed by circuitry 2321 to decode bit $b_3$ by first finding the symbol closest to the received signal symbol-and the associated metrics-in $(\Omega_{01} \; v \; \Omega_{11})$ and in $(\Omega_{00} \; v \; \Omega_{10})$. The trellis path is then extended as per conventional Viterbi decoding of the code implemented by coder 1142 (FIG. 5) to generate a final decision about a previously encoded information bit that was encoded by that coder. The decoded bit—one of the original most important bits—is provided as an output on lead 234. It is also reencoded within circuitry 2321 using the code of coder 1142 to provide bit $b_3$ to circuitry 2323 as well as to channel decoder 231 (FIG. 16), as described below, via lead 236. A version of the received symbol signal is delayed by delay element 2322 by a time sufficient to provide the value of bit $b_3$ as just described. That signal is then provided to circuitry 2323 along with bit $b_3$ to circuitry 2323 which then proceeds to decode bit $b_4$. This is carried out, in particular, by first finding the symbol closest to the received signal symbol—and the associated metrics—in supersymbol $\Omega_{0b_3}$ and in supersymbol $\Omega_{1b_3}$. The metrics are stored in a buffer and are used to perform maximum likelihood decoding of the code implemented by coder 1141 (FIG. 5), thereby to provide another of the most important bits on lead 234. At the same time, that bit is re-encoded within circuitry 2323 to provide bit $b_4$ to channel decoder 231 on lead 236.

It may be noted at this point that, obviously, circuitries 2321 and 2323 must be provided within information about the constellation that is being used in order to carry out their respective functions. That information is illustratively stored in a constellation store 2325 whose output—denoted as "A"—is provided to both of those circuitries, as well as to decoder 231 of FIG. 16.

Figure 16:
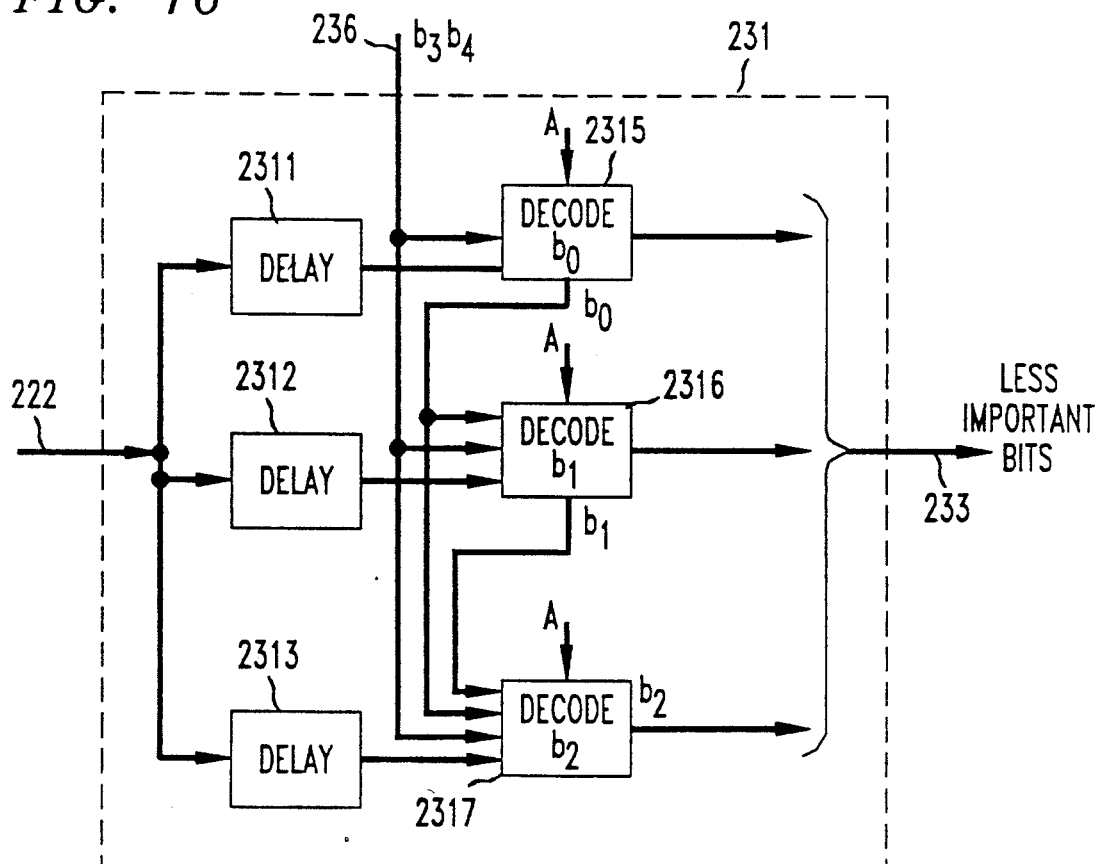

With the most important bits now provided on leads 234 and the values of bits $b_3$ and $b_4$ now being provided to decoder 231 on lead 236, the multi-stage decoding can now proceed—within the latter channel decoder-to recover the less important bits. To this end, as shown in FIG. 16, decoder 231 includes decode $b_0$ circuitry 2315, decode $b_1$ circuitry 2316, decode $b_2$ circuitry 2317, and delay elements 2311, 2312 and 2313. In operation, the received symbol signal is delayed by an amount equal to the processing delay within decoder 232 so that circuitry 2315 can be provided with bits $b_3$ and $b_4$ at the same time that it receives the received symbol signal. Circuitry 2315 then proceeds by first finding, within the supersymbol $\Omega_{b_4b_3}$, those symbols having $b_0=0$ and $b_1=1$ which are respectively closest to the received signal symbol. The trellis path is then extended, as before, using the metrics associated with those two closest symbols, leading ultimately to a decoding of bit $b_0$ and hence a recovery of one of the less important bits. That bit is then re-encoded within circuitry 2315 so as to be able to provide the value of bit $b_0$ to circuitries 2316 and 2317. The latter operate in a manner similar to that described above with respect to the other decode circuitries to recover the other less important bits, with the delays of delay elements 2312 and 2313 being sufficient to enable each of the circuitries 2316 and 2317 to receive the re-encoded bits, as needed.

Decoding in the case where multi-dimensional symbols are used is carried out in a similar manner, as will be appreciated by those skilled in the art.

The bits output by decoder 231 and 232 on leads 233 and 234, respectively, are descrambled by descramblers 241 and 242, which respectively perform the inverse function of scramblers 110 and 111 in the transmitter. A television signal formatted so as to be displayable by an appropriate television set is then generated from the descrambler outputs by source decoder 253, thereby recovering the original television information, or intelligence. That signal is then presented to the television viewer on television set 260.

Figure 2:
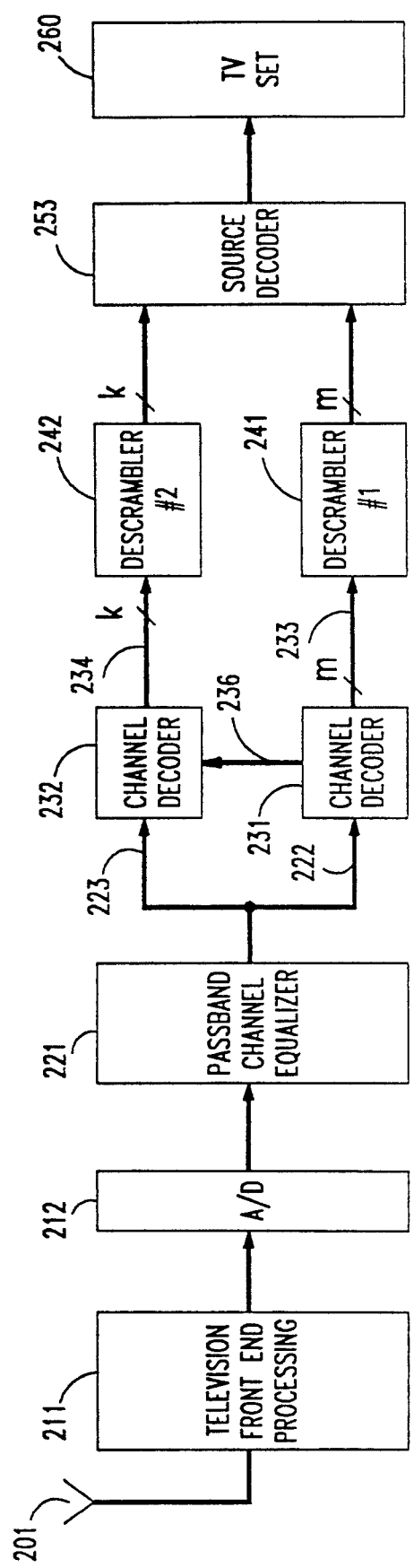
FIG. 2 is a block diagram of a receiver for transmitted signals transmitted by the transmitter of FIG. 1.

The performance of the overall unequal error protection signaling scheme implemented by the system of FIGS. 1 and 2, as just described, can now be characterized in terms of the nominal coding gain (i.e., the coding gain at very low error rates), this being the gain in signal-to-noise ratio over that of an uncoded 16-QAM system. The gain for the most important bits is 6.24 dB and for the less important bits is 2.70 dB when the number of states of each of the convolutional codes is chosen to be 16. The unique advantage of using multi-level coding, however, does not wholly lie with the particular levels of coding gain achieved. Unequal error protection signaling schemes that do not use multi-level coding may achieve comparable, or even better, coding gain results in particular applications. However, the use of multi-level coding is particularly advantageous is in its ability to provide the system designer with a greatly enhanced capability to pick the desired performance criteria, given the application, and to then readily arrive at a coding scheme which meets those criteria.

For example, the overall data rate of the above-described system can be increased from 3.75 to 3.875 bits per symbol without affecting the coding gain by changing the code implemented by coders 1141 and 1151 to a rate $R=15/16$ zero-sum parity check code (and using 16-bit, rather than 8-bit, buffers in the encoders). (At the same time, the percentage of most important bits increases ever so slightly—from 43.33% to 43.55%.) As another example, the percentage of most important bits can be reduced to 34.375%, while at the same time increasing the level of error protection afforded to those bits by a) changing the codes implemented by coders 1141, 1142, 1152 and 1153, to respectively, a rate $R=\frac{7}{8}$ punctured convolutional code; a rate $R=\frac{3}{4}$ convolutional code; a rate $R=\frac{7}{8}$ zero-sum parity check code; and a rate $R=\frac{3}{4}$ convolutional code; and b) eliminating coder 1151 so that the bits applied to buffer 1157 are uncoded bits. This arrangement achieves coding gains of 8 dB for the most important bits and 0.22 dB for the less important bits. Additionally, by changing the ratio of $d_2/d_1$ in FIG. 4, one can trade off the gains of the most important and less important bits. It will thus be seen that the use of multi-level coding allows for the use of a virtually unlimited range of design parameters—including the code rates, code complexity, overall coding redundancy, fraction of that redundancy used for error protection of the most important bits (as opposed to that used for the less important bits)—in order to meet desired system design criteria. This flexibility can be further enhanced by using various different signal constellations, including constellations having various different numbers of symbols, symbol spacings, supersymbol groupings and subset partitionings.

Indeed, the present invention provides a new class of constellations which may be advantageously used to provide the system designer with even further flexibility.

The constellations embodying the principles of the present invention are characterized by particular distance relationships within the constellation. Indeed, an important parameter in the design of coded modulation schemes is the so-called intra-subset distance. This parameter is the minimum distance between any two symbols in the subset. In coded modulation schemes which, unlike in the present invention, seek to provide equal error protection, the design constraint is to partition the constellation into subsets in such a way as to maximize the minimum of the intra-subset distances taken across all the subsets. This value, which we define as the "maximum intra-subset distance," or MID, has been achieved when, given a particular partitioning, any further attempt to increase the intra-subset distance of any particular subset (by making any other symbol-to-subset assignment changes) would not result in a further increase in the aforesaid minimum value.

Further, an important distinction between equal error protection and unequal error protection schemes needs to be kept in mind. In the former, the error protection for the so-called coded bits is determined by the minimum distance between subset sequences while the error protection for the uncoded bits is determined by the minimum distance between the symbols within a subset. Designers of equal-error-protection schemes want these two minimums to be as close to each other as possible because they want equal error protection for all the data. The performance of these schemes is dominated by the distance between the symbols within a subset. This results from the fact that one can always increase the complexity of the code in order to achieve whatever distance is desired between subset sequences.

In the case of unequal error protection, by contrast, the symbols in a supersymbol are selected by the less important bits. Thus the distance between these symbols can be significantly less than the MID. Indeed, it is limited only by the distance between the symbols of the constellation as a whole. This distance is chosen to provide the necessary level of error protection for the less important bits. Once we fix that distance, then the subset partitioning can be done to take advantage of this fact, thus making possible the realization of greater distances between the supersymbol sequences than would be possible with conventional coded modulation for the same complexity. We are, thus, no longer constrained to keep the symbols within a supersymbol far away from each other.

Taking the foregoing into account, constellations useful in unequal-error-protection signaling schemes are characterized by the fact that the minimum distance between at least some of the symbols of at least one of the supersymbols is less than the MID. Indeed, that criterion is met by constellations disclosed in the above-mentioned Wei patent application. However, in the disclosed Wei constellations, the minimum distance between the symbols of the supersymbols is the same as the minimum distance between the symbols of the constellation as a whole. By contrast, constellations embodying the principles of the present invention are not so constrained. That is, the minimum distance between at least ones of the symbols of at least one of the supersymbols is greater than the minimum distance between the symbols of the constellation as a whole while, again, still being less than the MID. Graphically speaking, constellations meeting this criterion will generally appear to have supersymbols which, at least to some degree, overlap (as do the subsets of the constellations used for equal error protection schemes). That is at least one symbol of a least one supersymbol will be closer to each of a pair of symbols of a different supersymbol than that pair of symbols are to each other.

Figure 7:
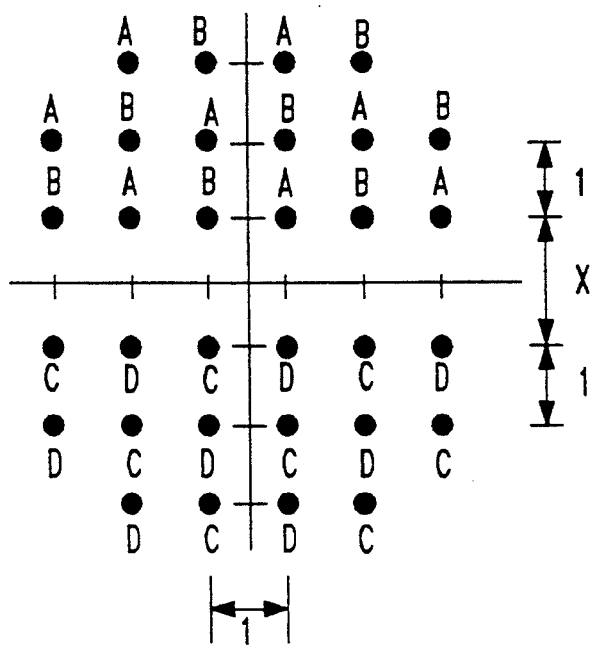
FIGS. 7 and 9 depict signal constellations that can be used by the transmitter of FIG. 1 in accordance with the principles of the invention.

One illustrative, 32-symbol, constellation embodying the principles of the present invention is shown in FIG. 7. This constellation is partitioned into four supersymbols, the constituent symbols thereof being labelled A, B, C and D, respectively. The distance labelled as "X" can be, for example, "1", thereby providing a constellation whose individual symbols are uniformly spaced. Or "X" can be greater than one—such as $\sqrt{3}$—thereby increasing some of the intersupersymbol distances. This provides an additional degree of design freedom in terms of achieving particular desired levels of error protection.

Figure 8:
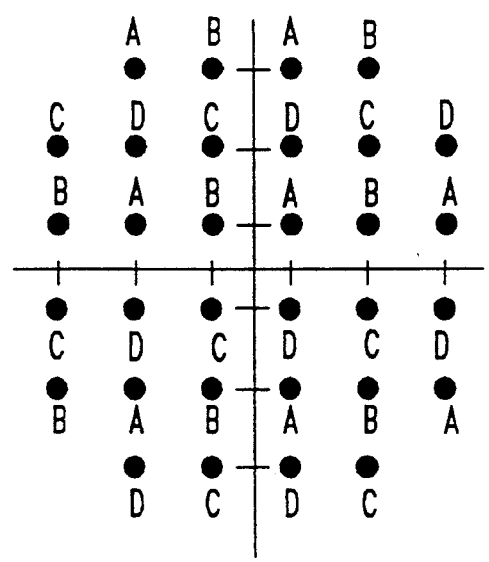
FIG. 8 depicts a signal constellation of the type typically used in equal error protection schemes.

The MID of the constellation of FIG. 7 is "2", which can be verified from a consideration of FIG. 8, in which the same constellation has been partitioned in order to provide equal error protection. That is, the minimum distance between any two symbols labelled "A", for example, is, in fact, "2". In FIG. 7, by contrast, the corresponding minimum distance, in accordance with the invention, is less than "2". Specifically, it is $\sqrt{2}$. And note that, from a graphical perspective, subsets A and B overlap one another, as do subsets C and D. (It is thus not possible to draw a box around the supersymbols, as was done in FIG. 4.)

Figure 9:
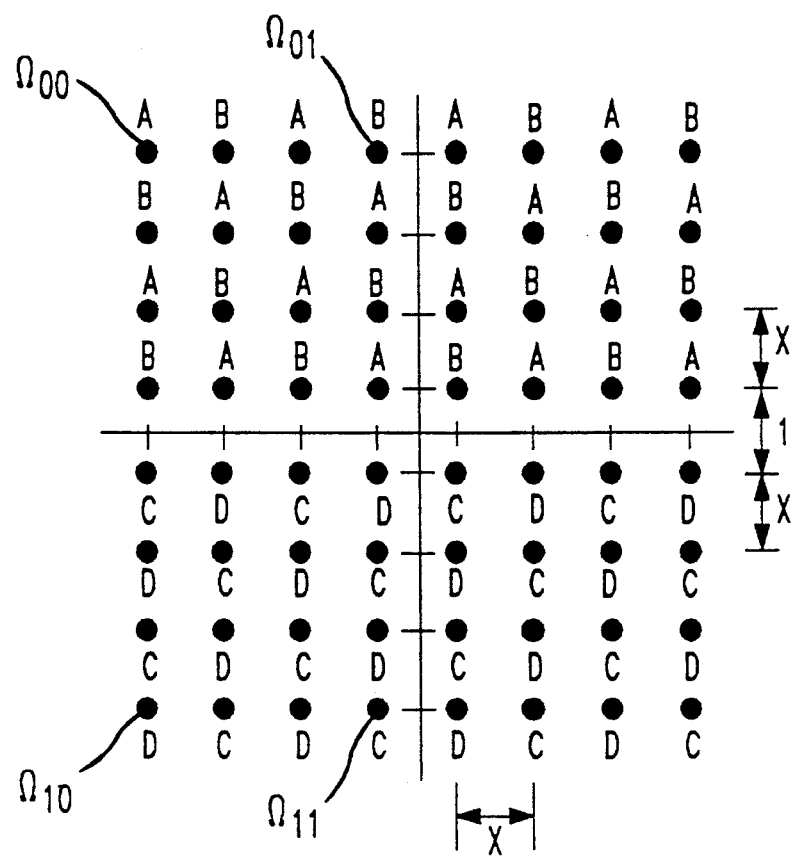

Another illustrative constellation embodying the principles of the invention—this one having 64 symbols—is shown in FIG. 9. Again, the constellation is partitioned into four supersymbols labelled using the same labelling convention as that used for FIG. 7.

(FIGS. 10–14 show yet further constellations that can be used, although these particular constellations do not meet the dual distance criteria set forth hereinabove. The same labelling conventions as described above are used in these constellations and thus nothing further need be said about them.)

The following two tables illustrate the tremendous flexibility provided by the combination of a) the use of multi-level coding and b) constellations embodying the principles of the invention in order to arrive at unequal-error-protection signaling schemes which provide various different combinations of a) percentage of most important bits, b) degree of overall code redundancy, c) coding gains, and d) radio of peak-to-average power (which is an important consideration in power-limited channels such as terrestrial and satellite telephone channels). TABLE 1 is a table of codes in which 25% of the bits constitute the most important bits. TABLE 2 is a table of codes in which various other percentages of the bits constitute the most important bits. Note that among the various possibilities are implementations which use the constellations of FIGS. 7 and 9 embodying the principles of the invention.

TABLE 1

Figure 10:
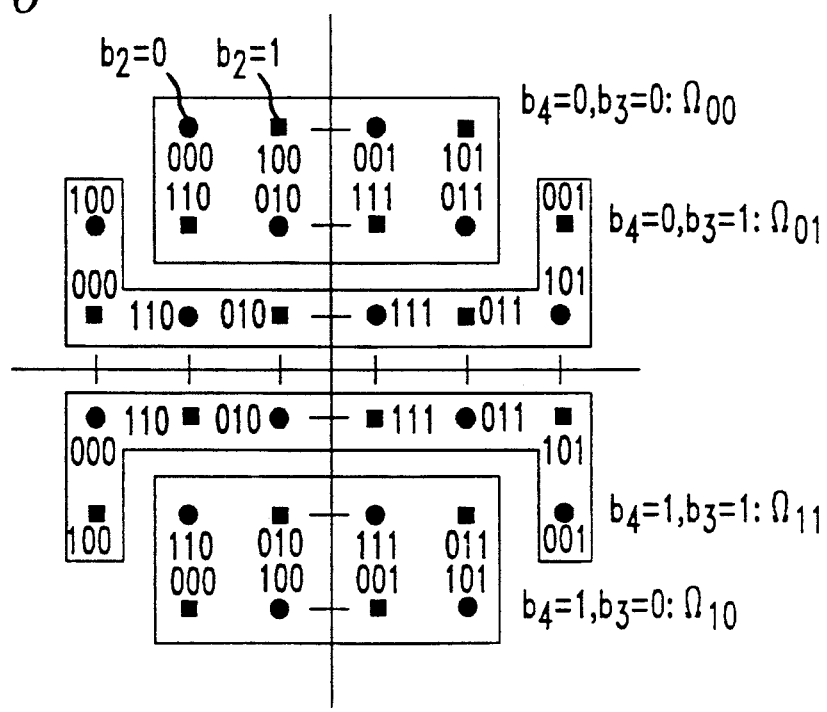

| Example | Signal Constellation | Code $C_0$ for important bits | Code $C_1$ for less important bits |
|---|---|---|---|
| 4A<br>25% most important data<br>rate 4 − 1/L | FIG. 10<br>P = 5/2, PAR = 1 · 7<br>$d^2(\Omega_{ab},\Omega_{cd}) \geq$<br>$\begin{cases} 4, \text{ if } ab = cd \\ 1, \text{ if } ab \neq cd \end{cases}$ | [23,35]:16-state, rate 1/2 convolutional code<br>$d^2(C_0) = 11$<br>Γ = 7.4 db | single parity check code with redundancy 1/L<br>$d^2(C_1) = 2$<br>γ = 0 dB |
| 4B<br>25% most important data | FIG. 7<br>P = 3.07, PAR = 1 · 7<br>$d^2(\Omega_{ab},\Omega_{cd}) \geq$ | [6,31]: 16-state, rate 1/2 convolutional code | single parity check code over $FF_4$ with redundancy 2/L |

TABLE 1-continued

Figure 11:
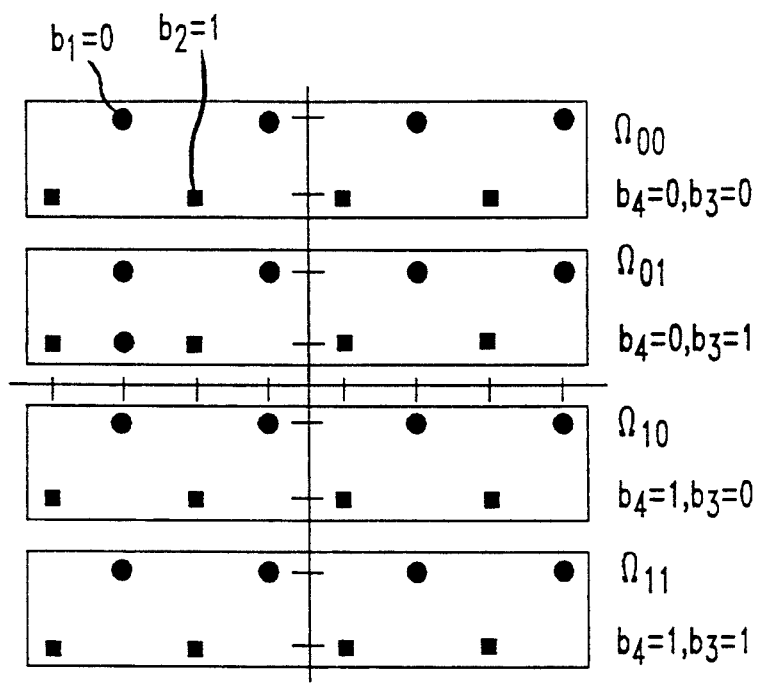
Figure 12:
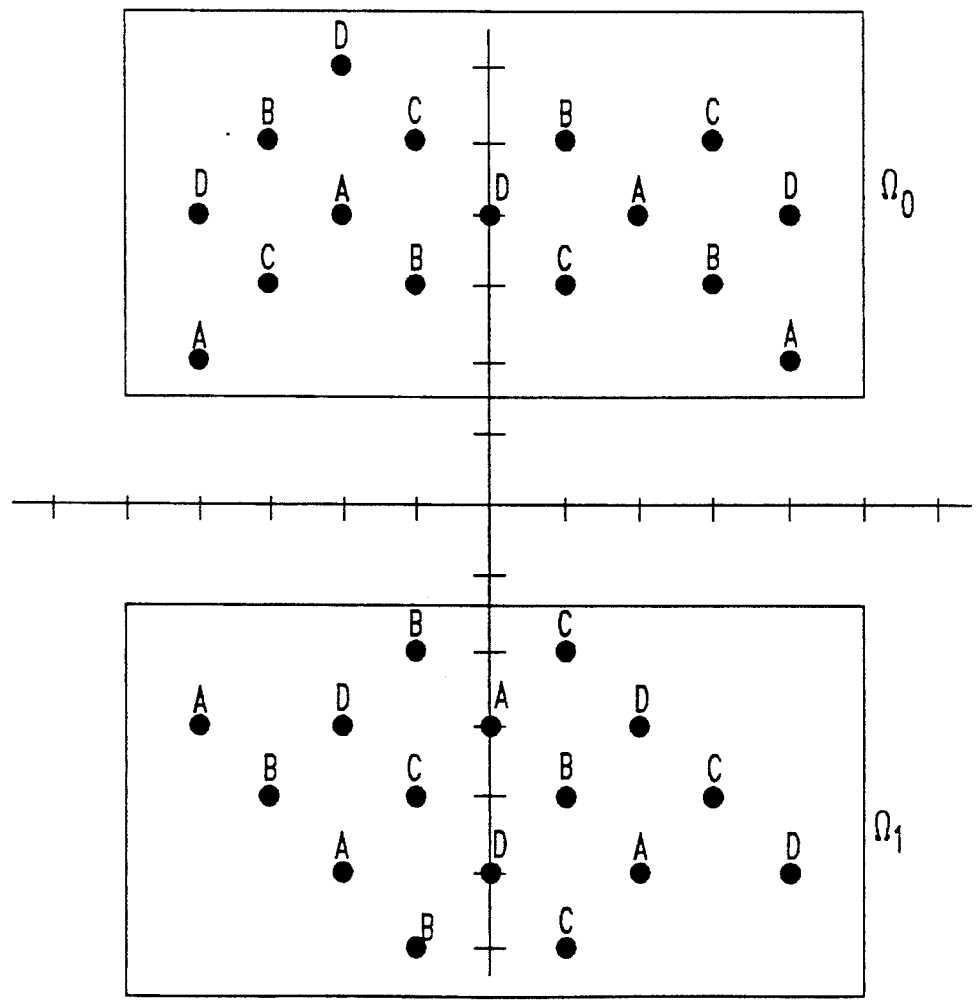

| Example | Signal Constellation | Code $C_0$ for important bits | Code $C_1$ for less important bits |
|---|---|---|---|
| rate 4 − 2/L | $\begin{cases} 4, \text{ if } ab = cd \\ 3, \text{ if } ab = cd \\ 1, \text{ if } ab = cd \end{cases}$ | $d^2(C_0) = 14$<br>$\Gamma = 7.6$ dB | $d^2(C_1) = 4$<br>$\gamma = 2.12$ dB |
| 4C<br>25% most important data<br>rate 4 − 1/L | FIG. 11<br>$P = 5.25$, PAR = 1 · 7<br>$d^2(\Omega_{ab}, \Omega_{cd}) \geqq$<br>$\begin{cases} 10, \text{ if } ab = cd \\ 2, \text{ if } ab \neq cd \end{cases}$ | [23,35]: see Example 4A<br>$d^2(C_0) = 26$<br>$\Gamma = 7.91$ dB | single parity check code with redundancy 1/L<br>$d^2(C_1) = 4$<br>$\gamma = 0.21$ dB |
| 4D<br>25% most important data<br>rate 4 − 2/L | FIG. 12<br>$P = 11$, PAR = 1 · 86<br>$d^2(\Omega_0, \Omega_1) = 25$ | single parity check code with redundancy 1/L<br>$d^2(C_0) = 50$<br>$\Gamma = 7.54$ dB | [23,35]: see Example 4A & parity check<br>$d^2(C_0) = 14$<br>$\gamma = 2.20$ dB |
| 4E<br>25% most important data<br>rate 4 − 1/L | FIG. 9<br>$P = (4 + 24x + 140x^2)/32$<br>$d^2(\Omega_{ab}, \Omega_{cd}) \geqq$<br>$\begin{cases} 1 + x^2, \text{ if } ab = cd \\ x^2, \text{ if } ab = cd \\ 1, \text{ if } ab = cd \end{cases}$<br>PAR = 2 · 05 for x = 0.3 | <br><br><br>x code $\Gamma$(dB)<br>0.4 [23,35] 4.92<br>0.3 [23,35] 6.11<br>0.2 [23,35] 7.90<br>0.1 [23,35] 10.10 | 2-level code: see Example 4D<br>$d^2(C_0) = 14x^2$<br><br>x $\gamma$(dB)<br>0.4  3.96<br>0.3  3.25<br>0.2  1.91<br>0.10−1.46 |

TABLE 2

Figure 13:
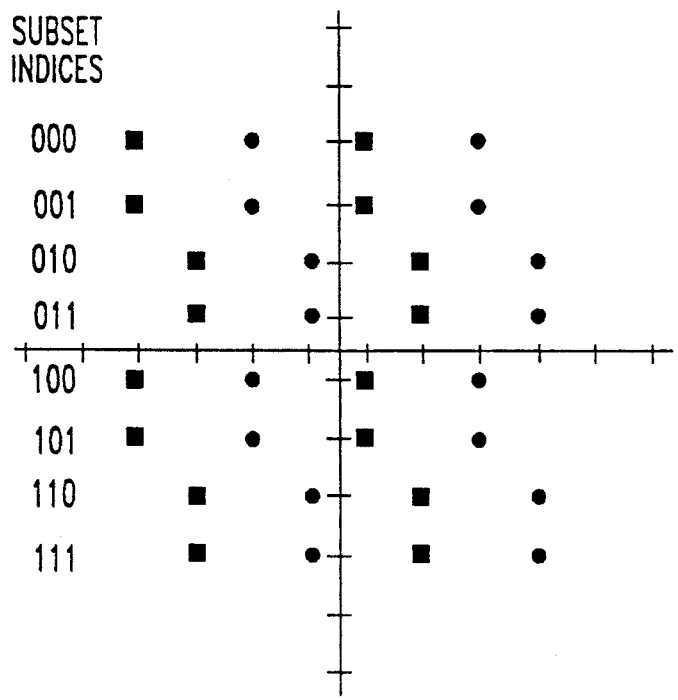
Figure 14:
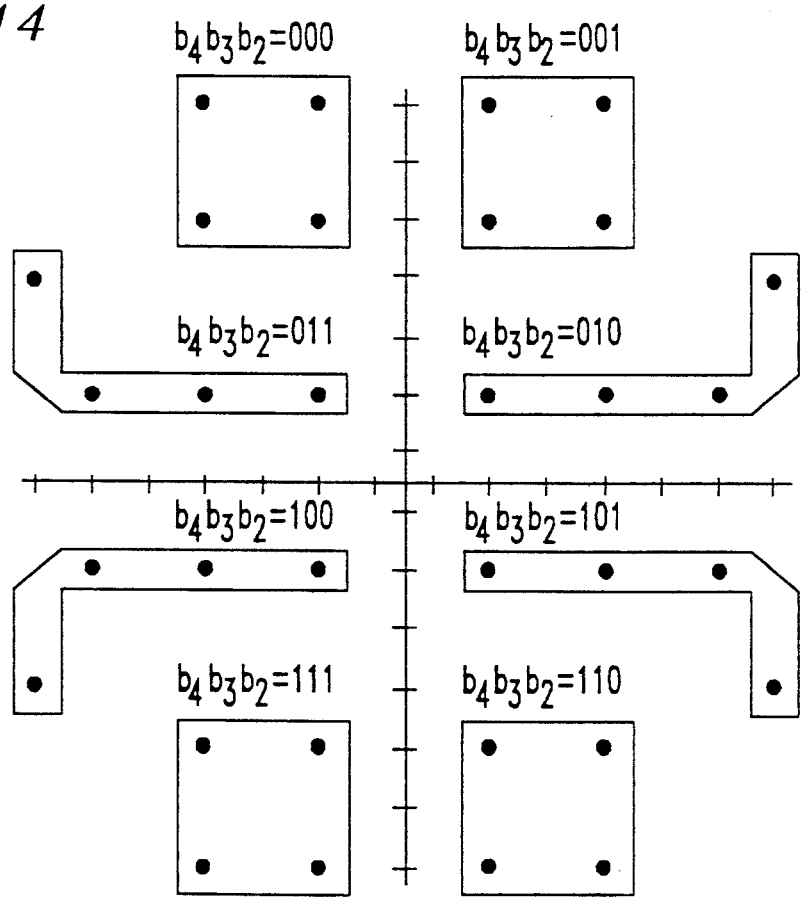

| Example | Signal Constellation | Code $C_0$ for important bits | Code $C_1$ for less important bits |
|---|---|---|---|
| 4F<br>50% important data<br>rate 4 − 1/L | FIG. 13<br>$P = 10.5$, PAR = 2 · 33<br>$d^2(\Omega_{ab}, \Omega_c) \geqq$<br>$\begin{cases} 5, \text{ if } ab = cd \\ 2, \text{ if } ab = cd \\ 1, \text{ if } ab = cd \end{cases}$ | [2,31]: 16-state, rate 1/2 convolutional code<br>$d^2(C_0) = 16$<br>$\Gamma = 5.8$ dB | single parity check code with redundancy 1/L<br>$d^2(C_1) = 8$<br>$\gamma = 2.8$ dB |
| 4G<br>33% important data<br>rate 4 − 2/L | FIG. 11<br>$P = 5.25$, PAR = 1 · 7<br>see Example 4C | 2-level code: -<br>[52,66,76]: 16-state rate 1/3 convolutional code, $d_H = 12$ & parity check<br><br>$d^2(C_0) = $ min<br>$(12 \times 2, 2 \times 10) = 20$<br>$\Gamma = 6.8$ dB | 2-level code: -<br>[31,33] with puncturing rule<br>$\begin{bmatrix} 1 & 1 \\ 1 & 0 \end{bmatrix}$, to give<br>16-state, rate 2/3 code, $d_H = 5$ & parity check<br>$d^2(C_1) = $<br>min$(5 \times 8, 2 \times 16, 64) = 32$<br>$\gamma = 2.8$ dB |
| 4H<br>37.5% important data<br>rate 4 − 1/L | FIG. 10<br>$P = 5.25$, PAR = 1 · 76<br>see Example 4C | 2-level code: -<br>[23,35]: 16-state rate 1/2 convolutional code, $d_H = 7$ & parity check<br>$d^2(C_0) = $ min<br>$(7 \times 2, 2 \times 10) = 14$<br>$\Gamma = 5.3$ dB | 2-level code: -<br>rate 2/3 punctured convolutional code from Example 4G & 16-state, rate 7/8 punctured convolutional code with $d_H = 3$<br>$d^2(C_1) = $<br>min$(40, 3 \times 16, 64) = 40$<br>$\gamma = 3.76$ dB |
| 4J<br>43.75% important data<br>rate 4 + 1/4 − 2/L | FIG. 4<br>$P = 4.75$, PAR = 1 · 9<br>$d^2(\Omega_{ab}, \Omega_{cd}) \geqq$<br>$\begin{cases} 8, \text{ if } ab = cd \\ 4, \text{ if } ab \neq cd \end{cases}$ | 2-level code: -<br>rate 3/4 convolutional code from Example 4F & parity check<br>$d^2(C_0) = $<br>min$(4 \times 4, 2 \times 8) = 16$<br>$\Gamma = 6.24$ dB | 3-level code: -<br>rate 1/2 convolutional code from Example 4A & rate 3/4 convolutional code from Example 4F & parity check<br>$d^2(C_1) = 7$<br>$\gamma = 2.7$ dB |
| 4K<br>56.25% important data | FIG. 14<br>$P = 16\frac{23}{32}$, PAR = 1 · 63 | 3-level code: -<br>rate 1/2 convolutional code from Example 4A & | 2-level code: -<br>rate 3/4 convolutional code from Example 4F & |

TABLE 2-continued

| Example | Signal Constellation | Code $C_0$ for important bits | Code $C_1$ for less important bits |
|---|---|---|---|
| rate 4 − 2/L | $d^2(\Omega_{abc}, \Omega_{def}) \geq$ <br> $\begin{cases} 9, \text{ if } c = f \\ 18, \text{ if } bc = ef \\ 36, \text{ if } abc = def \end{cases}$ | rate 3/4 convolutional code from Example 4F & parity check $d^2(C_0) = \min(63,72,72) = 63 \; \Gamma = 6.73 \text{ dB}$ | parity check $d^2(C_1) = 16$ <br> $\gamma = 0.78 \text{ dB}$ |
| 4L <br> 22.5% important data <br> rate 3 + 7/8 − 1/L <br> (power penalty) <br> 0.75 dB | FIG. 12 <br> P = 11, PAR = 1 · 86 <br> $d^2(\Omega_0, \Omega_1) = 25$ | [23,35] with puncturing rule [1010011, 110010] to give 16-state rate 7/8 convolutional code with $d_H = 3$ <br> $d^2(C_0) = 75$ <br> $\Gamma = 8.55 \text{ dB}$ | see Example 4D <br> $d^2(C_1) = 14$ <br> $\gamma = 1.27 \text{ dB}$ |

In these tables, P denotes the average power per dimension; PAR denotes the peak-to-average power ratio; $d^2$ denotes the squared Euclidian distance between the supersymbols represented by its arguments; $\Gamma$ denotes the nominal coding gain for the more important bits; $\gamma$ denotes the nominal coding gain for the less important bits; and [$g_1$, $g_2$] is the generator matrix, in octal notation, for the convolutional codes indicated; L is the length of the parity check code. For non-uniform constellations, the degree of non-uniformity is determined by x. The tables also show the achievable gains as a function of x.

In designing unequal error protection signaling schemes, such as those just presented in TABLES 1 and 2, one typically must first be given the values of certain parameters. These include (a) available channel bandwidth, (b) the worst-case channel SNR, (c) the number of classes of bits, (d) the percentage of bits in each class, (e) the desired quality of the final received signal under the worst case channel conditions, (f) acceptable decoder complexity, and (g) peak-to-average power ratio. One can then proceed to design an unequal-error-protection scheme consistent with the given parameter values.

Typically, one might begin by choosing the signal constellation to allow for about one overall bit of redundancy per symbol. The number of supersymbols that is needed is determined by the actual number of important bits per symbol. For example, if more than 25%, and less than 50%, of the bits are important, and if the available bandwidth and required overall bit rate dictate, say, four information bits per symbol, then we will have to transmit one important bit per symbol. Assuming, further, that it is desired to provide some amount of redundancy for the important bits and that those bits will be used to select the supersymbols, then it may be reasonable to use a two-dimensional constellation having four supersymbols. Various of the constellations disclosed herein, or any other desired constellation, can be used as the initial design choice. Advantageously, a constellation embodying the principles of the present invention may be used. One would then proceed to select codings to be used for the bit streams depending on the relative redundancies desired. If, upon analysis, it appears that the desired quality at the worst-case SNR is not achieved with the design arrived at to this point, other constellations—including constellations having different values of the parameter "X" as indicated in FIGS. 7 and 9—and other codes can be explored with a view toward seeing whether it can, in fact, be achieved. If this does not appear possible, one or more of the previously given constraints, such as acceptable decoder complexity, may have to be relaxed. Other design criteria are conceivable as well as other parameters that may affect the choice of the code design.

In accordance with a feature of the invention, an advantageous technique is provided for assigning the values of the bits that are used to select the symbols from each identified supersymbol to those symbols. In accordance with that technique, a pair of symbols from respective different supersymbols are assigned to the same less-important-bit values if the distance between that pair of symbols is the minimum distance between any pair of symbols of those two supersymbols. Such a scheme is illustrated in FIG. 10, in which, like in FIG. 4, each symbol is labelled with a $b_2,b_1,b_0$ set of values. Note, for example, that the symbols labelled 110 in each of the supersymbols $\Omega_{00}$, $\Omega_{01}$, $\Omega_{10}$ and $\Omega_{11}$ all satisfy the aforementioned criterion. Such a labelling scheme—which is achievable to varying degrees, depending on the constellation and supersymbol geometries—is advantageous in that it improves the probability that the less-important-bit values will be decoded properly, even if an error is made in recovering the correct supersymbol sequence. Beyond this, it may be possible to achieve further benefit by similar judicious choice of bit assignments for those symbols which do not meet the above-mentioned minimum distance criterion. This would need to be done, however, within the constraints that are imposed by any coding that is implemented for the symbols within the supersymbol, as was, in fact, the case of the example described above in conjunction with the constellation of FIG. 4.

The foregoing merely illustrates the principles of the present invention. For example, although two-dimensional constellations are shown, the invention can be used in schemes using constellations with more than two dimensions.

It may also be noted that although the invention is illustrated herein as being implemented with discrete functional building blocks, e.g., source coders, scramblers, etc., the functions of any one or more of those building blocks can be carried out using one or more appropriate programmed processors, digital signal processing (DSP) chips, etc.

It will thus be appreciated that those skilled in the art will be able to devise numerous and various alternative arrangements which, although not explicitly shown or described herein, embody the principles of the invention and are within its spirit and scope.

We claim:

1. Apparatus for channel coding successive groups of data elements, said apparatus comprising redundancy coding means for redundancy encoding a first group of data elements to generate a first redundancy coded group of data elements and for identifying one of a plurality of supersymbols of a predetermined channel symbol constellation in response to the first redundancy coded group of data elements, each supersymbol being comprised of a respective plurality of symbols forming a subset of the constellation, and means for selecting an individual one of the symbols of the identified supersymbol at least in response to a second group of data elements, and for applying to a communication channel a signal representing the selected symbol, the minimum distance between the symbols within at least one of the supersymbols being a) less than the maximum intrasubset distance for said constellation and b) greater than the minimum distance between the symbols of the constellation as a whole, and said at least one supersymbol having at least two symbols in at least one quadrant of the constellation.

2. The invention of claim 1 wherein sets of values of said second group of data elements are assigned to the symbols of said constellation in such a way that a pair of symbols from respective different supersymbols are assigned to the same set of said values if the distance between that pair of symbols is the minimum distance between any pair of symbols of said respective different supersymbols and wherein said selecting and applying means performs said selecting as a function of said assigned values.

3. The invention of claim 1 wherein the selecting and applying means includes means for encoding said second group of data elements to generate a second redundancy coded group of data elements and for selecting said individual symbol in response to the second redundancy coded group of data elements.

4. The invention of claim 1 further comprising means for generating said data elements by source coding input information in such a way that said first group of data elements represents a portion of said information that is more important than the portion of said information represented by said second group of data elements.

5. The invention of claim 4 wherein said information is television information.

6. Apparatus for channel coding successive groups of m+k data bits associated with respective symbol intervals, said apparatus comprising means for redundancy encoding during each said interval m of the bits of one of the groups to generate a redundancy coded group of r bits, r>m, means for identifying a particular one of $2^r$ supersymbols of a predetermined channel symbol constellation as a function of the values of said r bits, each of said supersymbols being comprised of a plurality of symbols forming a subset of said constellation, and means for generating a signal representing a selected one of the channel symbols of the identified one supersymbol, the selection being performed as a function of the values of the other k bits of said one group, the minimum distance between the symbols within at least one of the supersymbols being a) less than the maximum intrasubset distance for said constellation and b) greater than the minimum distance between the symbols of the constellation as a whole, and said at least one supersymbol having at least two symbols in at least one quadrant of said constellation.

7. The invention of claim 6 wherein sets of values of said second group of bits are assigned to the symbols of said constellation in such a way that a pair of symbols from respective different supersymbols are assigned to the same set of said values if the distance between that pair of symbols is the minimum distance between any pair of symbols of said respective different supersymbols and wherein said selection is further performed as a function of said assigned values.

8. The invention of claim 6 further comprising means for generating said data bits by source coding input information in such a way that said m bits represent a portion of said information that is more important than the portion of said information represented by said k bits.

9. The invention of claim 8 wherein said information is television information.

10. The invention of claim 9 wherein said generating means includes means for encoding the other k bits of said one of the groups to generate a redundancy coded group of p bits, p>k and for selecting said individual symbol in response to said redundancy coded group of p bits.

11. Apparatus for use in a receiver which receives intelligence communicated to said receiver by a transmitter, said transmitter being adapted to channel code successive groups of m+k data bits associated with respective symbol intervals via the steps, performed for each said interval, of a) redundancy encoding m of the bits of one of the groups using a first predetermined code to generate a redundancy coded group of r bits, r>m; b) identifying a particular one of $2^r$ supersymbols of a predetermined channel symbol constellation as a function of the values of said r bits, each of said supersymbols being comprised of a plurality of symbols forming a subset of said constellation assigned thereto and the minimum distance between the symbols within at least one of the supersymbols being i) less than the maximum intrasubset distance for said constellation and ii) greater than the minimum distance between the symbols of the constellation as a whole, and said at least one supersymbol having at least two symbols in at least one quadrant of the constellation; c) generating a signal representing a selected one of the channel symbols of the identified one supersymbol, the selection being performed as a function of the values of the other k bits of said one group; and d) communicating said signal to said receiver over a communication channel;

said apparatus comprising means for receiving said signal from said channel, and means for recovering said intelligence from the received signal, said recovering being carried out in response to information stored in said receiver about said first predetermined code, about said constellation, and the manner in which said symbols are assigned to their respective supersymbols.

12. The invention of claim 11 wherein sets of values of said second group of bits are assigned to the symbols of said constellation in such a way that a pair of symbols from respective different supersymbols are assigned to the same set of said values if the distance between that pair of symbols is the minimum distance between any pair of symbols of said respective different supersymbols and wherein said recovering is further carried out in response to information stored in said receiver about the way in which said values are assigned to said symbols.

13. The invention of claim 11 wherein the signal generating step in the transmitter includes the steps of a) encoding the other k bits of said one of the groups using a second predetermined code to generate a second redundancy coded group of p bits, p>k; and b) selecting said individual symbol in response to the second redundancy coded group of data bits, and wherein said recovering means carries out said recovering further in response to information stored in said receiver about said second predetermined code.

14. The invention of claim 13 wherein said intelligence is television information.

15. A method comprising the steps of redundancy encoding a first group of data elements to generate a first redundancy coded group of data elements, identifying one of a plurality of supersymbols of a predetermined channel symbol constellation in response to the first redundancy coded group of data elements, each supersymbol being comprised of a respective plurality of symbols of the constellation forming a subset, selecting an individual one of the symbols of the identified supersymbol at least in response to a second group of data elements, and applying to a communication channel a signal representing the selected symbol, the minimum distance between the symbols within at least one of the supersymbols being a) less than the maximum intrasubset distance for said constellation and b) greater than the minimum distance between the symbols of the constellation as a whole, and said at least one supersymbol having at least two symbols in at least one quadrant of said constellation.

16. A method of channel coding successive groups of m+k data bits associated with respective symbol intervals, said method comprising the steps, performed for each said interval, of redundancy encoding m of the bits of one of the groups to generate a redundancy coded group of r bits, r>m, identifying a particular one of $2^r$ supersymbols of a predetermined channel symbol constellation as a function of the values of said r bits, each of said supersymbols being comprised of a plurality of symbols of said constellation forming a subset, and generating a signal representing a selected one of the channel symbols of the identified one supersymbol, the selection being performed as a function of the values of the other k bits of said one group, the minimum distance between the symbols within at least one of the supersymbols being a) less than the maximum intrasubset distance for said constellation and b) greater than the minimum distance between the symbols of the constellation as a whole, and said at least one supersymbol having at least two symbols in at least one quadrant of said constellation.

17. A method for use in a receiver which receives intelligence communicated to said receiver by a transmitter, said transmitter being adapted to channel code successive groups of m+k data bits associated with respective symbol intervals via the steps, performed for each said interval, of a) redundancy encoding m of the bits of one of the groups using a first predetermined code to generate a redundancy coded group of r bits, r>m; b) identifying a particular one of $2^r$ supersymbols of a predetermined channel symbol constellation as a function of the values of said r bits, each of said supersymbols being comprised of a plurality of symbols forming a subset of said constellation assigned thereto and the minimum distance between the symbols within at least one of the supersymbols being i) less than the maximum intrasubset distance for said constellation and ii) greater than the minimum distance between the symbols of the constellation as a whole, and said at least one supersymbol having at least two symbols in at least one quadrant of said constellation; c) generating a signal representing a selected one of the channel symbols of the identified one supersymbol, the selection being performed as a function of the values of the other k bits of said one group; and d) communicating said signal to said receiver over a communication channel;

said method comprising the steps of receiving said signal from said channel, and recovering said intelligence from the received signal, said recovering being carried out in response to information stored in said receiver about said first predetermined code, about said constellation, and the manner in which said symbols are assigned to their respective supersymbols.

* * * * *